(12) United States Patent
Funaya et al.

(10) Patent No.: US 7,829,199 B2
(45) Date of Patent: Nov. 9, 2010

(54) SOLDER, AND MOUNTED COMPONENTS USING THE SAME

(75) Inventors: Takuo Funaya, Tokyo (JP); Osamu Myohga, Tokyo (JP); Koji Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 1031 days.

(21) Appl. No.: 11/587,008

(22) PCT Filed: Apr. 21, 2005

(86) PCT No.: PCT/JP2005/007611

§ 371 (c)(1),
(2), (4) Date: Oct. 20, 2006

(87) PCT Pub. No.: WO2005/102594

PCT Pub. Date: Nov. 3, 2005

(65) Prior Publication Data

US 2008/0026240 A1    Jan. 31, 2008

(30) Foreign Application Priority Data

Apr. 21, 2004    (JP) .............................. 2004-125935

(51) Int. Cl.
*C22C 13/00* (2006.01)
*B23K 35/26* (2006.01)
(52) U.S. Cl. .................. 428/646; 420/560; 420/562
(58) Field of Classification Search .................. None
See application file for complete search history.

(56) References Cited

U.S. PATENT DOCUMENTS 6,109,506 A  *  8/2000  Blair et al. ................. 228/175

| | | | | |
|---|---|---|---|---|
| 6,241,942 B1 | * | 6/2001 | Murata et al. | ............... 420/561 |
| 2004/0262779 A1 | * | 12/2004 | Amagai et al. | ............. 257/779 |
| 2006/0011702 A1 | * | 1/2006 | Funaya et al. | ............. 228/56.3 |
| 2006/0261131 A1 | * | 11/2006 | Hirata et al. | ................. 228/101 |

FOREIGN PATENT DOCUMENTS

| CN | 1421296 A | 6/2003 |
|---|---|---|
| JP | 59-189096 | 10/1984 |
| JP | 05-050286 | 3/1993 |
| JP | 09-094687 | 4/1997 |
| JP | 11-129091 | 5/1999 |
| JP | 11-320177 | 11/1999 |

(Continued)

OTHER PUBLICATIONS

Machine translation of JP 11-129091. Sep. 27, 2009.*

(Continued)

*Primary Examiner*—John J Zimmerman
(74) *Attorney, Agent, or Firm*—Young & Thompson

(57) ABSTRACT

An Sn—Zn alloy solder having a composition comprising 7 to 10 mass % of Zn, 0.075 to 1 mass % of Ag, and 0.07 to 0.5 mass % of Al; further comprising one or two components selected from 0.01 to 6 mass % of Bi and 0.007 to 0.1 mass % of Cu; and optionally comprising 0.007 to 0.1 mass %, with the balance being Sn and unavoidable impurities. The solder has the same processability, service conditions, and connection reliability as conventional Sn-37 mass % Pb eutectic solder, and does not contain the biologically harmful lead.

6 Claims, 6 Drawing Sheets

FOREIGN PATENT DOCUMENTS

| | | |
|---|---|---|
| JP | 2000-015478 | 1/2000 |
| JP | 2001-168513 | 6/2001 |
| JP | 2001-203444 | 7/2001 |
| JP | 2001-347394 | 12/2001 |
| JP | 2002-195433 | 7/2002 |
| JP | 2002-283093 | 10/2002 |
| JP | 3357045 | 10/2002 |
| JP | 2004-034099 | 2/2004 |

OTHER PUBLICATIONS

Machine translation of JP 2001-347394. Sep. 29, 2009.*
Machine translation of JP 2004-034099. Sep. 29, 2009.*

* cited by examiner

Zn-5Al

ALLOY COMPOSITION

Zn-5Al-1Mg

Zn-5Al-1Cu

Zn-5Al-1Mg-1Cu

SOLDER, AND MOUNTED COMPONENTS USING THE SAME

TECHNICAL FIELD

The present invention relates to solder and mounted components using the same.

BACKGROUND ART

When electronic components are mounted on a surface of a circuit board, a cream solder is conventionally used in which Sn-37 mass % Pb eutectic solder in the form of the metal particles is kneaded with flux. Sn-37Pb eutectic solder has a eutectic temperature of 183° C. The temperature profile is designed so that the maximum temperature within the reflow oven is 220° C. to 240° C. in order to make the minimum temperature on the board to be the eutectic temperature of the Sn-37Pb eutectic solder or greater in cases in which the board has large dimensions, and components having considerable heat capacity are mounted on the board.

A conventional Sn—Ag eutectic-based solder alloy material such as that described in Japanese Patent No. 3027441 has a melting temperature is 220° C. or higher, which is about 40° C. higher than 183° C. The latter temperature is the melting point of ordinary Sn-37Pb eutectic solder. The solder alloy material is used as a substitute material for Sn-37Pb eutectic solder in connections between printed circuit boards and electronics components.

In Japanese Patent No. 1664488 (Japanese Laid-open Patent Application No. 59-189096), Bi is added to the Sn—Zn-based solder to ensure higher strength. In Japanese Laid-open Patent Application No. 9-94687, adhesion strength is increased by adding 0.1 to 3.5 mass % of Ag to an Sn—Zn-based solder. Also, in Japanese Laid-open Patent Application No. 2001-347394, Al, In, Ni, Cu, Ag, and other elements are added to an Sn—Zn-based solder to increase strength (hardness), improve wettability, and lower the melting point. In Japanese Laid-open Patent Application No. 2002-195433, Ag and Bi are added to an Sn—Zn-based solder to increase strength (hardness), improve wettability, and lower the melting point. In Japanese Patent No. 3357045 as well, Al is added to an Sn—Zn-based solder to improve wettability.

[Patent Document 1] Japanese Patent No. 3027441
[Patent Document 2] Japanese Patent No. 1664488
[Patent Document 3] Japanese Laid-open Patent Application No. 9-94687
[Patent Document 4] Japanese Laid-open Patent Application No. 2001-347394
[Patent Document 5] Japanese Laid-open Patent Application No. 2002-195433
[Patent Document 6] Japanese Patent No. 3357045

DISCLOSURE OF THE INVENTION

Problems that the Invention is to Solve

However, the prior art described above has the following problems.

The first problem is that lead contained in conventional Sn-37Pb eutectic solder is harmful to humans.

This is because industrial waste from products manufactured using Sn-37Pb eutectic solder elutes lead into the ground due to acid rain and the like, and the lead is taken into the human body through underground water.

The second problem is that a conventional Sn—Ag eutectic-based solder alloy material such as that described in Japanese Patent No. 3027441 has a melting temperature of 220° C. or higher, which is about 40° C. higher than 183° C., the melting point of ordinary Sn-37Pb eutectic solder.

The reason is that when electronic components are mounted on a surface of a circuit board with the aid of a reflow oven for a conventionally known common Sn-37Pb eutectic solder, the maximum temperature in the oven exceeds 250° C. when the surface area of the circuit board is considerable or when components having considerable heat capacity are mounted on the board if the minimum temperature of the entire mounting surface in the oven is 220° C. or higher, which is the melting temperature of SN—Ag eutectic solder. This temperature exceeds the guaranteed heatproof temperature of current CPUs and numerous other electronic components, and renders the mounted products unreliable.

In order to offset this problem, acquiring a new reflow oven is required that allows uniform heating with a smaller difference between the maximum and minimum temperatures within the oven than a conventional oven, and installation costs are incurred. Also, the heat resistance of the components must be improved, but the semiconductor characteristics of Si semiconductor devices and the like tend to be compromised, and there is a limit to improvements that can be made to the heat resistance of components.

The third problem is that when an Sn—Zn—Bi-based unleaded solder is used such as that described in the Japanese Patent No. 1664488, it is difficult to maintain the same initial adhesion strength in a high-temperature, high-humidity atmosphere and a heat cycle test in which mounted electronic components are alternately exposed for about 10 to 30 minutes to temperatures of −40° C. and 125° C.

The reason is that the strength degrades in the heat cycle test in which the mounted electronic components are alternately exposed for about 10 to 30 minutes to temperatures of −40° C. and 125° C. when 3 to 20 mass % of bismuth is added and electronic components are melted and connected to copper electrodes on a circuit board using an Sn—Zn—Bi-based solder. Furthermore, when only Bi is added to an Sn—Zn-based solder and zinc is oxidized in a high-temperature, high-humidity atmosphere, the solder material itself becomes very weak together with the brittle Bi, and the strength of the solder connection degrades.

The fourth problem is that even if sufficient strength can initially be achieved by adding Al, In, Ni, Cu, Ag, or the like to Sn—Zn based solders such as those described in Japanese Laid-open Patent Application Nos. 9-94687 and 2001-347394 by utilizing the compositions described in Japanese Laid-open Patent Application Nos. 9-94687 and 2001-347394, strength degrades in a high-temperature, high-humidity test of 85° C. and 85% or in other conditions, an alloy composition with sufficient reliability cannot be obtained, and the melting temperature is high, resulting in poor processability. Also, connection reliability cannot be obtained in a high-temperature, high-humidity test of 85° C. and 85% by simply adding Al or Bi to an Sn—Zn based solder, in the same manner as Japanese Patent No. 3357045.

The reason is that the base metal of the solder cannot not achieve sufficient strength by a simple addition of silver to a Sn—Zn based solder, as in the alloy composition described in Japanese Laid-open Patent Application No. 9-94687. Strength degrades in a high-temperature, high-humidity test of 85° C. and 85% or in other conditions even if aluminum or bismuth is added to an Sn—Zn based solder such as that described in Japanese Laid-open Patent Application No. 2001-347394 and Japanese Patent No. 3357045. The melting point approaches the eutectic temperature of an Sn—Cu solder when 0.1 to 1 mass % of Cu is added, and the melting point increases to the vicinity of the eutectic temperature of Sn—Ag solder when 1 to 5 mass % of Ag is added as in Japanese Laid-open Patent Application No. 2001-347394, thereby exceeding the guaranteed heatproof temperature of the electronic components conventionally used in mounting with Sn—Pb eutectic solder. The solder is an Sn—Zn-based solder, i.e., an Sn—Zn eutectic structure without a parent phase, and the melting temperature range becomes wider. Therefore, the structure becomes coarser, segregation tends to occur, and the material easily corrodes in a high-temperature, high-humidity environment.

The fifth problem is that in order to obtain reliability in a high-temperature, high-humidity test of 85° C. and 85%, it is not sufficient to simply add Ag to the Sn—Zn—Bi-based solder in the composition described in Japanese Laid-open Patent Application No. 2002-195433 as described in Japanese Laid-open Patent Application No. 2002-195433, and the amount of Ag added is not adequate for achieving reliability.

The reason is that the alloy structure readily becomes coarse, leading to strength degradation when held at a high temperature, and the strength readily degrades in a high-humidity atmosphere when attempting to add 0.075 mass. % or less of Ag. Also, simply adding Ag to an Sn—Zn—Bi-based solder is not sufficient to prevent strength degradation due to oxidation of the Zn-rich phase formed inside the solder.

The sixth problem is that when 0.1 to 3.5 mass % is added to an Sn—Zn-based solder as in Japanese Laid-open Patent Application No. 9-94687, the melting point rapidly increases when 1 mass % or more of silver is added.

The reason is that the eutectic temperature of Sn—Ag is about 220° C. or higher, and the Ag phase precipitates. For this reason, mounting at the temperature profile of ordinary Sn-37Pb becomes impossible, the guaranteed heatproof temperature of electronic components is exceeded because the melting point is about 40° C. higher than Sn-37Pb, and the reliability of the mounted component is compromised.

Means of Solving the Problems

An object of the present invention is to provide a solder that has the same processability, service conditions, and connection reliability as the conventional Sn-37Pb eutectic solder, and that does not contain the biologically harmful lead.

Another object of the present invention is to provide a mounted electronic component having high connection reliably by using the solder of the present invention.

The solder according to the first aspect of the present invention is characterized in having a composition comprising 7 to 10 mass % of Zn, 0.075 to 1 mass % of Ag, and 0.07 to 0.5 mass % of Al, and one or two components selected from 0.01 to 6 mass % of Bi and 0.007 to 0.1 mass % of Cu, with the balance being Sn and unavoidable impurities.

The solder according to the second aspect of the present invention is characterized in having a composition comprising 7 to 10 mass % of Zn, 0.075 to 1 mass % of Ag, 0.07 to 0.5 mass % of Al, 0.007 to 0.1 mass % of Cu, and 0.007 to 0.1 mass % of Mg, with the balance being Sn and unavoidable impurities.

The solder according to the third aspect of the present invention is characterized in having a composition comprising 7 to 10 mass % of Zn, 0.075 to 1 mass % of Ag, 0.07 to 0.5 mass % of Al, 0.01 to 6 mass % of Bi, and 0.007 to 0.1 mass % of Mg, with the balance being Sn and unavoidable impurities.

The solder according to the fourth aspect of the present invention is characterized in having a composition comprising 7 to 10 mass % of Zn, 0.075 to 1 mass % of Ag, and 0.07 to 0.5 mass % of Al, 0.01 to 6 mass % of Bi, 0.007 to 0.1 mass % of Cu, and 0.007 to 0.1 mass % of Mg, with the balance being Sn and unavoidable impurities.

The mounted component according to the present invention is characterized in comprising an electronic component, and a circuit board in which the electronic component is soldered using a solder that has of any of the above compositions.

Effects of the Invention

As described above, the solder alloy material according to the present invention uses tin, which has a low melting point and excellent strength, and does not use the biologically harmful lead.

In other words, lead does not elute into the ground to be taken into the human body through underground water. This is because the material that is used is a eutectic solder alloy composition that is nearest to 183° C., which is the eutectic temperature of Sn-37Pb eutectic solder, e.g., an unleaded solder material in which Sn-8.8Zn is the parent phase having a eutectic temperature of 199° C. More specifically, when a product that is mounted and produced using the unleaded solder paste of the present invention is discarded, there are no harmful effects comparable to those produced by lead eluted into the ground from acid rain, such as is the case with Sn-37Pb eutectic crystals.

With the unleaded solder of the present invention, the liquidus temperature of all the metal components within the cream solder is reduced by using, for example, the Sn-8.8Zn eutectic structure as the parent phase, adding 0.01 mass % or more and 6 mass % or less of Bi and/or 0.007 mass % or more and 0.01 mass % or less of Cu, and adding 0.007 mass % or more and 0.1 mass % or less of Mg as required. Therefore, the difference in the melting point with the Sn-37Pb eutectic crystals is 10° C. to 20° C., there is no need to newly acquire a reflow oven that can uniformly heat across the entire mounting surface, and the same reflow oven as used for conventional Sn-37Pb eutectic solder can be used. Hence, costs for installing new equipment are not incurred.

Since the electronic components can be mounted in the same guaranteed heatproof temperature ranges as for those when conventional Sn-37Pb eutectic solder is used, functionally reliable mounted products can be manufactured.

The Sn-8.8Zn eutectic material, which is an example of a metal component parent phase inside the unleaded cream solder according to the present invention, has a eutectic temperature of 199° C., which is the nearest temperature to 183° C. (which is the eutectic temperature of Sn-37Pb eutectic solder) among the eutectic temperatures of binary alloys, as described above. Therefore, in comparison with solder that has another eutectic alloy as a base thereof, the material can be used in conditions that are most proximate to the service temperature conditions of the Sn-37Pb eutectic solder employed with mounted electronic components. With a solder alloy material that has an Sn—Ag eutectic material as its base, the melting temperature is 220° C. or higher and is about 40° C. higher than 183° C., which is the melting point of ordinary Sn-37Pb eutectic solder. Therefore, if the minimum temperature in the oven for the entire mounted surface is 220° C. or higher, which is the melting temperature of Sn—Ag eutectic material, the maximum temperature inside the oven often exceeds 250° C. if the substrate surface area is greater than an A4-sized paper or if electronic components with different heat capacities are used together when electronic components are mounted on a surface of a circuit board by using a general conventional reflow oven for Sn-37Pb eutectic solder.

This temperature exceeds the guaranteed heatproof temperature of current CPUs and many other electronic components, and the mounted products lack reliability. The unleaded cream solder that has Sn-8.8Zn eutectic crystal as a base in accordance with a specific example of the present invention can be used in conventional reflow ovens that are used for mounting with Sn-37Pb eutectic cream solder, the maximum temperature in the oven can be reduced to the heatproof temperature or less of the mounted components, and the reliability of the functional aspect of the product is not compromised.

Furthermore, to bring the melting point closer to that of Sn-37Pb eutectic solder by using an Sn—Zn eutectic structure, bulk alloys having a plurality of compositions were fabricated, and the melting points of these alloys were measured using a DSC (differential scanning calorimeter). As a result, a solder alloy material was developed in which an Sn—Zn eutectic structure was used as base metal and which had a composition comprising 0.07 to 0.5 mass % of Al; at least one or more elements selected from 0.01 mass % or more and 6 mass % or less of Bi and 0.007 mass % to 0.1 mass % of Cu; and 0.007 to 0.1 mass % of Mg preferably included in the case that Cu or Bi is included, with the balance being Sn and unavoidable impurities. In the present invention, the solder alloy to which Ag has been added was furthermore developed to improve the characteristics of the above-described solder composition, and the solder alloy was confirmed to achieve effects such as the following.

Specifically, the liquidus temperature can approach the eutectic temperature of Sn-37Pb alloy through the use of a solder alloy having the composition of the present invention. For this reason, there is no need to newly acquire a reflow oven that can uniformly heat across the entire mounting surface, and the same reflow oven as used for conventional Sn-37Pb eutectic solder can be used. Hence, costs for installing new equipment are not incurred. Also, since electronic components can be mounted in their guaranteed heatproof temperature ranges, the components can be reliably mounted from a functional aspect.

KEY

Figure 1:
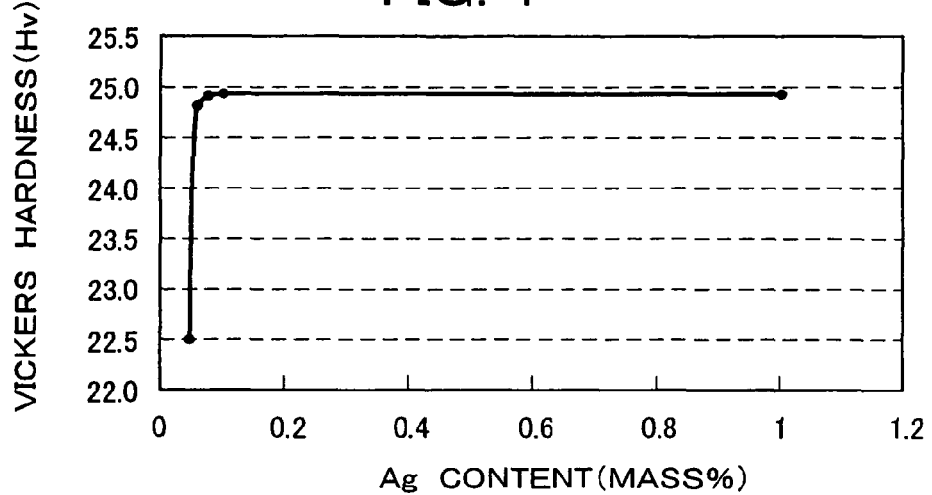
FIG. 1 is a graph showing the relationship between the Ag content and Vickers hardness.

81: shear strength measurement device
82: solder
83: chip resistor
84: circuit board electrode
85: circuit board

BEST MODE FOR CARRYING OUT THE INVENTION

Described below with reference to the attached diagrams are the reasons for adding components and the reasons for limiting compositions in the solder according to the present invention. The solder according to the present invention is basically an Sn (tin)-Zn (zinc)-based alloy which has Sn as the base metal, furthermore contains Ag (silver) and Al (aluminum), and also contains at least one element selected from Bi (bismuth) and Cu (copper). The solder may also contain Mg (magnesium).

Described below are the reasons for adding each component and the reasons for limiting the composition of the components.

7 to 10 Mass % of Zn

A Sn—Zn-based solder alloy that contains the solder according to the present invention has an advantage of being a eutectic alloy whose melting point is most proximate to Sn—Zn eutectic solder, but when Zn is oxidized in a high-temperature, high-humidity environment of 85° C. and 85%, there is a problem in that cracks are generated beginning with the oxidized zinc, leading to reduced strength. The present invention strengthens the Sn-rich phase and the Zn-rich phase within Sn—Zn eutectic solder by addition of Ag to the Sn—Zn based solder alloy and form the solid solution of Ag. This is done in order to ameliorate the conventional problem in which strength is degraded by the oxidation of the Sn-rich phase and the Zn-rich phase within Sn—Zn eutectic solder in the Sn—Zn based solder alloy. The problem of strength degradation can thereby be solved.

In other words, the solder material according to the present invention is a material in which the parent phase of the alloy material is an Sn-7 to 10 mass % Zn eutectic structure. The eutectic structure, which is the parent phase, is nearest to 183° C., which is the eutectic temperature of Sn-37Pb eutectic alloy, among the eutectic temperatures of the binary alloys, as described above. Therefore, when the solder material is used to mount electronic components, the material can be used in conditions that are most proximate to the service temperature conditions of solder composed of an Sn-37Pb eutectic alloy in comparison with solder based on other eutectic alloys.

In other words, the unleaded solder material of the present invention is a binary eutectic alloy having an Sn—Zn eutectic structure as the parent phase. In comparison with an alloy that does not have a eutectic structure, a binary eutectic alloy generally has greater strength, less solidification shrinkage, better fluidity when melted, and less element segregation than a dense structure. For this reason, the zinc content of the present invention is 7 to 10 mass % as a range in which the same strength as a eutectic structure can be obtained, based on the tensile test cited in JIS Z 2241, the creep tests cited in JIS Z 2271 and JIS Z 2272, the Vickers hardness test cited in JIS Z 2244, and other tests.

Due to the Zn content, the strength of an Sn—Zn eutectic structure readily decreases because brittle zinc oxide forms inside the solder in a high-temperature, high-humidity atmosphere of 85° C. and 85%. The solder of the present invention has an Sn—Zn eutectic structure as a parent phase, and 0.07 to 0.5 mass % of Al, 0.007 to 0.1 mass % of Mg, and 0.007 to 0.1 mass % of Cu are added so as to obtain a material that does not easily lose solder strength, particularly when the Zn-rich phase is oxidized. This is achieved by improving the Zn-rich phase that tends to oxidize and become brittle in the solder in a high-temperature, high-humidity atmosphere, which is a problem for solder that uses conventional Sn—Zn eutectic solder.

0.075 to 1 Mass % of Ag

As described above, degradation of solder strength can be prevented by strengthening the Sn-rich phase and the Zn-rich phase within Sn—Zn eutectic alloy through addition of Ag to form the solid solution of Ag. In other words, the strength of the solder of the present invention can be increased by adding Ag to reduce the size of zinc crystal particles, and by forming the solid solution of Ag in the Sn-rich phase and Zn-rich phase to obtain a solid solution strengthening, as described above. The Ag content in the solder of the present invention is 0.075 to 1 mass %, and it is apparent from the experiment results described below that the tensile elongation, tensile strength, and hardness can be increased by adding such an amount of Ag in comparison with not adding Ag. Hence, the Ag content is set to 0.075 to 1 mass % in order to obtain the above-described effects.

In the present invention, when 0.1 mass % or more of Ag is added, the effect of lowering the melting point by adding Bi to the Sn—Zn eutectic structure is lost, but the melting point can be further reduced by adding Mg and Al. Conversely, when more than 1 mass % of Ag is added, the effect of increasing the toughness of the alloy by a solid solution of Ag in the metallurgical structure is lost, the Ag-rich phase precipitates, the melting point increases rapidly, the concentration readily segregates due to a wider temperature range in which the solid and liquid phases coexist, the precipitation phase becomes larger in high-temperature environments, the solder easily corrodes in high-humidity environments, and the reliability of joined areas is lost.

0.07 to 0.5 Mass % of Al

However, simply adding Ag to an Sn—Zn eutectic alloy is not sufficient to maintain the required strength for retaining reliability in a high-temperature, high-humidity environment of 85° C. and 85%, even if the connection reliability is good in a heat cycle test. Therefore, in the present invention, 0.07 to 0.5 mass % of Al is added besides Ag for the purpose of enhancing the strength of the easily oxidized Zn-rich phase. Aluminum essentially does not form a solid solution in the Sn base phase, a fine-grained, Al-rich phase precipitates inside the Zn-rich phase or in the vicinity of the phase, and the strength is enhanced. Thus, by adding aluminum in the present invention, a fine-grained, Al-rich phase are precipitated inside the Zn-rich phase or in the vicinity of the Zn-rich phase because aluminum essentially does not form a solid solution in Sn, and thus the strength of the alloy can be enhanced.

0.01 to 6 Mass % of Bi

The solder of the present invention has a Bi content of 0.01 to 6 mass %. Adding Bi in a prescribed amount has the effect of improving wettability on a copper plate, enhancing the initial adhesion strength, and lowering the melting point in comparison with not adding Bi to an Sn—Zn-based alloy solder. The lower limit of the Bi content is 0.01 mass %, which is the minimum content that yields the effect of lowering the melting point. When the Bi content is less than 0.01 mass %, no change can be seen in the strength. If the Bi content is greater than 6 mass %, the adhesion strength of the solder is equal to or less than that of conventional Sn-37Pb alloy solder when a heat cycle test is performed in which components are alternately exposed for about 10 to 30 minutes to temperatures of −40° C. and 125° C., and connection reliability becomes a problem. For this reason, considering the advantages related to connection reliability, wettability, and the melting point, the Bi content is preferably set to from 0.01 to 6 mass %. It is furthermore possible to increase the strength of the solder base metals in addition to the Zn-rich phase and to obtain high connection reliability by adding 0.01 to 6 mass % of Bi.

0.007 to 0.1 Mass % of Mg

A hard Zn—Mg intermetallic compound phase is precipitated in the Zn-phase and strength is increased by adding Mg. Therefore, in the present invention, the required strength can be maintained in order to preserve reliability in a high-temperature, high-humidity environment of 85° C. and 85% by adding 0.007 to 0.1 mass % of Mg besides Bi.

0.007 to 0.1 Mass % of Cu

The same effects as adding Bi can be obtained by adding 0.007 to 0.1 mass % of Cu in place of Bi. The hard Zn—Mg intermetallic compound phase in the Zn-rich phases precipitates due to the addition of Mg, and strength can be increased, but when the hard Zn—Mg intermetallic compound phase in the Zn-rich phases precipitates, the material becomes brittle, and Cu is therefore preferably added at the same time when Mg is added. Since Cu has the effect of very finely dispersing the Zn—Mg intermetallic compound phase, the Sn—Zn-base solder can be prevented from becoming brittle, the strength is increased, and a high-toughness solder can be obtained.

As described above, with the solder according to the present invention, adding a trace amount of Al increases the strength inside or in the vicinity of the Zn-rich phase within the solder, and adding Mg and Cu further increases the strength of the Zn-rich phase and reduces the melting point of the solder. The solder according to the present invention has excellent mechanical strength and physical and chemical properties. In comparison with other eutectic alloy-based solders or nearly eutectic alloy-based solders, electronic components can be mounted at a melting point that is proximate to the melting point of Sn-37Pb when the solder is used to mount electronic components. Therefore, the electronic components can be mounted at or below their guaranteed heatproof temperature, and high connection reliability can be obtained even in high-temperature, high-humidity environments and in high and low ambient temperature variations.

The solder material according to the present invention can be used to connect electronic components to each other or to connect electronic components to a circuit board, but the material is not limited to these applications. The type of material is also not limited to a cream solder obtained by pulverizing a solder alloy for surface mounting, classifying the particles into a particle diameter range of 20 μm to 40 μm, and thereafter kneading the particles so that the content of flux in the weakly activated flux is 12 mass %. The material can also be used as ingots for insertion mounting and wire soldering with the aid of a soldering iron, but no limitation is imposed by these applications. It is apparent that the solder according to the present invention does not exclude the fact that impurities can be mixed in the staring materials of Sn, Zn, Al, Ag, Bi, Cu, and Mg, and trace amounts of impurities are mixed in the solder in the melting oven or in other steps in the manufacturing process.

With the cream solder according to the present invention, electronic components can be mounted on a circuit board in the same reflow conditions and the same temperature profile as in the prior art, and a mounted product can be obtained having the same or greater reliability as that provided by a conventional tin-lead eutectic solder in heat cycle tests and high-temperature, high-humidity tests. For this reason, there are no costs required for acquiring and installing a new high-temperature oven, and since electronic components can be mounted in their conventional guaranteed heatproof temperature ranges, product design does not need to be changed and products having the same or greater reliability can be manufactured.

Ordinarily, a particle diameter range of 20 μm to 40 μm is advantageously used to separate particles during the formation of a cream solder, but when the electrode wiring has a narrow pitch or the surface area of the cream solder to be printed is small, a finer powder may be used. The flux content of the cream solder can be modified according to service conditions in a range of about 9 mass % to 13 mass % in accordance with storage stability, printing quality, and other factors, but the flux content is not limited to these parameters. Also, examples of the circuit board that can be used to form connections include printed boards, ceramic boards, glass boards, and Si boards, but the circuit board is not limited to these examples. Advantageous examples of the surface treatment of circuit-board electrodes include Cu, Au, Sn, Sn—Pb alloy, Sn—Ag—Cu alloy, Sn—Zn alloy, and flux, but the surface treatment is not limited to these examples.

Examples of the electronic components that can be advantageously connected include chip resistors, chip capacitors, bare LSI chips, SOP (Small Out-line Package), QFP (Quad Flat Package), BGA (Ball Grid Array), DIP (Dual In-line Package), and PGA (Pin Grin Array), but the electronic components are not limited to these examples.

EXAMPLES

Described next are the experiment results that form the basis for stipulating the elemental compositions constituting the solder of the present invention.

FIG. 1 is a graph showing the relationship between the Ag content of the horizontal axis and the Vickers hardness on the vertical axis. The measurements show the results of preparing a plurality of solder alloy materials for the examples having compositions in which the Ag content is varied at 0.05 mass %, 0.075 mass %, 0.15 mass %, and 1 mass % in an Sn—Zn alloy containing 8 mass % of Zn, 0.07 mass % of Al, and 0.05 mass % of Bi; holding the solder alloy materials for 1,000 hours in a high-temperature, high-humidity state of 85° C. and 85%; and thereafter measuring the Vickers hardness.

The Vickers test was performed in accordance with JIS Z2244 under a test load of 15 g and a pressure time of 10 seconds. FIG. 1 shows that the hardness of a composition held at a high temperature was low when the Ag content was 0.05 mass % or less. This is due to the fact that the bulkier crystal particles of the Zn-rich phase led to strength degradation, and the hardness decreased from the Vickers hardness that the composition had prior to being held at high temperature and high humidity. When the Ag content exceeded 0.075 mass %, the crystal particles did not become coarser, and there was no adverse effect on the strength inside or in the vicinity of the Zn-rich phase according to the present invention. Therefore, the same strength as that of the initial solder was maintained. For this reason, the Ag content must be kept at 0.075 mass % or higher in order to maintain the desired connection reliability.

Figure 2:
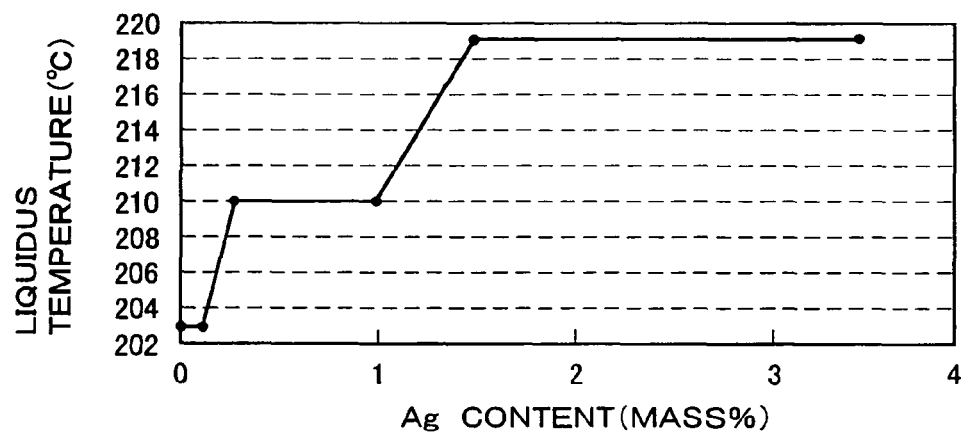
FIG. 2 is a graph showing the relationship between the Ag content and the liquidus temperature.

FIG. 2 shows the liquidus temperature variation obtained by DSC measurement for a plurality of types of solder alloy materials having compositions in which the Ag content is varied at 0 mass %, 0.1 mass %, 0.3 mass %, 1 mass %, 1.5 mass %, and 4 mass % in an Sn—Zn alloy containing 8 mass % of Zn, 0.07 mass % of Al, and 0.05 mass % of Bi. DSC measurement was carried out by measuring the material at a temperature increase rate of 10° C. per minute from room temperature to 300° C., and measuring the liquidus and solidus temperatures from the resulting endothermic peak. There was substantially no difference in the DSC measurement peak of the liquidus temperature when the addition was kept to 0.1 mass % in comparison with not adding Ag. When the addition was 0.1 mass % or more and 1.0 mass % or less, a separate peak produced by the addition of Ag was superposed in the high-temperature shoulder portion of the single DSC endothermic peak, but the liquidus temperature was substantially constant at 210° C.

Conversely, when more than 1.0 mass % Ag is added, the endothermic peak separates into two peaks, and the peak on the high-temperature side approaches about 220° C., which is the eutectic temperature of Sn and Ag. For this reason, an addition that is 1 mass % or more leads to a rapid increase in the melting point, it is difficult to reflow components having a conventional guaranteed heatproof temperature, an alloy structure with coarse Ag precipitates is formed, and reliability declines due to concentration segregation and corrosion. Therefore, the Ag content must be 1 mass % or less.

FIGS. 3, 5, 8, 9, and 12 described below are diagrams showing the effects of adding the elements Al, Mg, and Cu for the purpose of strengthening the Zn-rich phase, which readily loses strength due to oxidation. Each element was added in a trace amount, but since it was confirmed that Al, Mg, and Cu substantially do not form a solid solution in Sn, the effects that Al, Mg, and Cu have on the Zn structure were studied by fabricating an ingot in which the additive elements Al, Mg, and Cu were added to Zn, and observing the structure in order to describe in simple terms the internal structure of the Zn-rich phase having fine needle shapes inside the Sn—Zn solder. FIGS. 4, 6, 10, and 13 show the measurement results of the Vickers hardness. The same results were obtained with a solder that does not have an Sn—Zn eutectic structure as the base metal of the present invention. This was observed based on observing the structure using an SEM (scanning electron microscope) and measuring the Vickers hardness as shown in FIG. 4.

Figure 3:
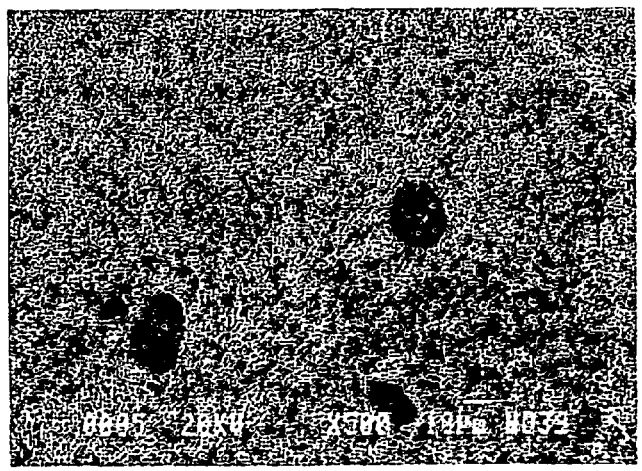
FIG. 3 shows an SEM photograph of a Zn-5Al eutectic structure.
Figure 4:
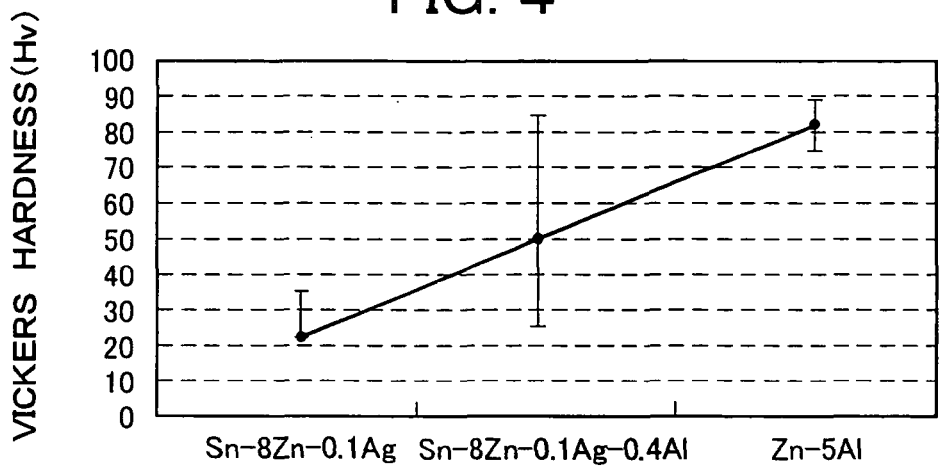
FIG. 4 is a graph showing the measurement results of Vickers hardness that show the effects of Al in the present invention.

FIG. 3 is a photograph taken by melting and solidifying Zn and Al in a Zn-5Al eutectic structure, polishing the bulk surface, and observing the alloy structure using an SEM (scanning electron microscope) in order to monitor the structural change due to the addition of Al to the Zn-rich phase in the present invention. The aluminum-rich phase in FIG. 3 is indicated by the black contrast in the diagram, and the white contrast in the diagram corresponds to the Zn-rich phase. It was found that adding Al to the Zn gives the Zn-rich phase a dense eutectic structure. The reason that such a fine-grained structure has excellent strength is that the fine crystal grains form, and when stress is applied, the number of dislocations concentrated on the particle boundaries is less than when the crystal particles are coarse, and damage at the grain boundaries can be prevented when the dislocation density in the substance is constant.

When Al is added to solder that has an Sn—Zn eutectic structure as the base phase in accordance with the present invention, substantially no solid solution is formed by the Al in Sn, but a trace amount of Al forms a solid solution in Zn. However, if the Al content is 0.07 mass % or higher, the solid solution limit in the Zn is exceeded when the Al content is about 1.0 mass % or more with respect to the weight content of Zn, i.e., a minimum Zn content of 7 mass % in the solder. It was confirmed from electron diffraction and electron imagery obtained by using an EDX (Energy dispersive X-ray spectroscope) that the Al phase precipitates from the Zn. It was also confirmed by TEM (Transmission Electron Microscope) that the bulk of the material forms flakes. It is therefore apparent that an alloy structure having a stronger structure can be obtained in the present invention.

A eutectic structure with the lowest melting point is obtained when the Al content is about 5 mass % with respect to the Zn content described above. Therefore, when the Al content is 5 mass % or more with respect to the Zn content, i.e., the Zn is a maximum of 10 mass % in the solder according to the present invention, adding 0.5 mass % or more of Al increases the melting point temperature and a coarse Al phase that readily oxidizes is formed. The strength characteristics are therefore negatively affected.

When 0.07 mass % or more and 0.5 mass % or less of Al is added to the solder of the present invention, measurements of the Vickers hardness test in accordance with the JIS Z 2244 indicate that the interior and vicinity of the Zn-rich phase is strengthened in comparison with previous cases in which the a coarse Zn phase is present in the Sn, as shown in FIG. 4 described below. Since the Zn-rich phase is fine-grained, the result is a dense structure in which dislocations are less likely to concentrate on the grain boundaries in comparison with the Zn-rich phase in a conventional Sn—Zn-based solder. Therefore, strength degradation can be prevented because the formation of very fine crystal grains prevents the concentration of stress on the zinc oxide, even if the Zn corrodes while held in high-humidity atmosphere and embrittled zinc oxide has been formed. Hence, the connection reliability of the product can be assured even in a high-humidity atmosphere by using the solder of the present invention.

FIG. 4 shows the results of a hardness test performed to study the effects of improving the strength of the Zn-rich phase by adding a trace amount of Al according to the present invention. FIG. 4 shows the results of measuring Vickers hardness for ingots composed of an Sn-8Zn-0.1Ag alloy, an Sn-8Zn-0.1Ag-0.4Al alloy, and a Zn-5Al alloy. Measurement of Vickers hardness was carried out in accordance with JIS Z2244 under a test load of 15 g and a pressure time of 10 seconds.

A conventional Sn—Zn eutectic solder is composed of a Sn-rich phase and a Zn-rich phase. Both phases are soft and have a low Vickers hardness of 50 or less. When the zinc is allowed to corrode in a high-humidity atmosphere of 85° C., 85% humidity, and the like, the strength tends to degrade because the Zn-rich phase becomes a brittle zinc oxide, and the connection reliability is poor.

However, based on the results of measuring Vickers hardness of the Sn-8Zn-0.1Ag-0.4Al alloy, the Sn—Zn-based solder of the present invention was found to be harder than Sn-8Zn-0.1Ag alloy, which is a solder in which a trace amount of Ag has been added to a conventional Sn—Zn eutectic alloy. For alloys with a larger hardness value, it was also found from the results of actual tensile tests that the solder of the present invention had increased strength.

This is due to the fact that the structure of the Zn-rich phase in the solder of the present invention is improved and the strength increased by the elemental addition of aluminum and by the increased strength of the solder base metal brought about by the addition of Ag, which forms a new phase from the elemental addition of aluminum inside or in the vicinity of the Zn-rich phase in the solder. This is indicated by the variability of the measurement results indicated by the line in the diagram of the hardness measurement results. This was also confirmed by the fact that the maximum value for the Sn-8Zn-0.1Ag-0.4Al alloy was the value that was obtained when the indenter of the hardness meter was used to measure the Zn-rich phase in the solder, and that the value substantially agreed with the hardness of the Zn-5Al ingot.

Therefore, high strength and reliability can be obtained by forming a new phase through the elemental addition of aluminum inside or in the vicinity of the Zn-rich phase, even if the solder of the present invention is subject to the formation of conventional zinc oxide due to zinc-phase corrosion in a highly humid atmosphere.

Figure 5:
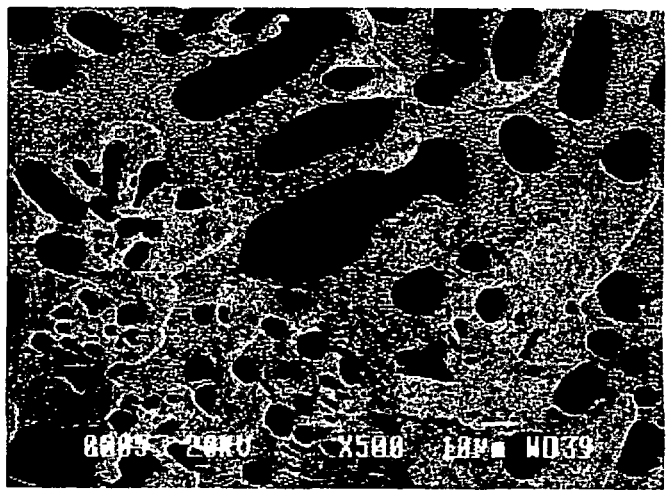
FIG. 5 shows an SEM photograph for observation of a Zn-5Al-1Mg eutectic structure.

FIG. 5 is an SEM photograph taken to study the effect on the Zn-rich phase of adding Al and Mg to the Zn-rich phase in the solder of the present invention. The solder was prepared by melting and solidifying Zn, Al, and MG into a composition consisting of Zn-5Al-1Mg, polishing the bulk surface, and observing the alloy structure. When Al and Mg are added to solder that has an Sn—Zn eutectic structure as a parent phase, the Al and Mg substantially do not form a solid solution in Sn, and the Al and Mg, as well as trace amounts of Al and Mg, form a solid solution in Zn. Therefore, Al and Mg have an effect on the metallurgical structure of the Zn-rich phase in the solder.

It is apparent from FIG. 5 and an EDX elemental analysis that when the Mg content is considerable, a hard Zn—Mg intermetallic compound phase precipitates in coarse form in the fine-grained Zn—Al eutectic alloy structure. In the diagram, the aluminum-rich phase is indicated by the black contrast, and the white contrast corresponds to the Zn-rich phase. The strength is increased by adding Mg, as shown in FIG. 6, but it is apparent that a brittle material is formed in response to stress concentration brought about by the concentration of dislocations along the grain boundaries due to the hard Zn—Mg intermetallic compound phase, which has simultaneously precipitated in the coarse form shown in FIG. 5.

Figure 12:
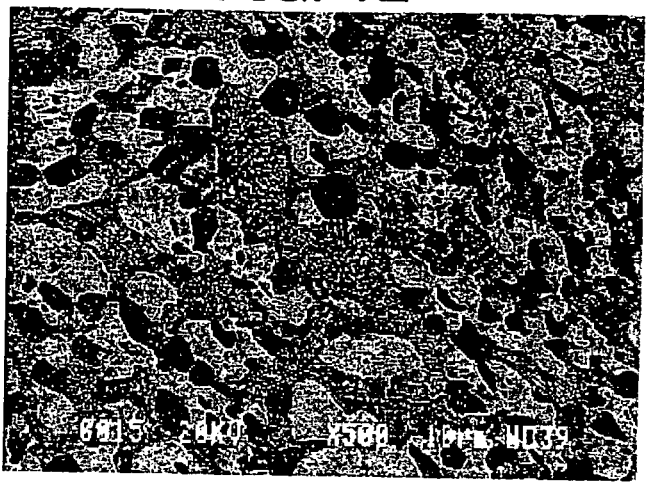
FIG. 12 shows an SEM photograph of solder having a Zn-5Al-1Mg-1Cu composition.

Reliability was considered for solder-joined locations in which heat stress is generated after solder connection. When the Mg is 1 mass % or less with respect to the Zn content in the solder, i.e., a maximum Zn content of 10 mass % in the present solder, it is preferable to add 0.1 mass % or less of Mg. This was confirmed from the crack initiation conditions in heat cycle tests of chip resistors, QFP, and other electronic components and solder-joined areas. Also, when Cu is added at the same time as Mg, the hard Zn—Mg intermetallic compound is very finely dispersed because the structure in the Zn-rich phase and the vicinity thereof is fine-grained structure, as shown in FIG. 12, and the concentration of dislocations along the grain boundaries can be avoided and the connection reliability can be further enhanced even if brittle zinc oxide is formed in a highly humid atmosphere. It was confirmed from Vickers hardness measurements that adding Mg has no observable effect on the strength if the Mg is 0.1 mass % or less with respect to the Zn content. Therefore, Mg has no effect when the added amount is 0.007 mass % or less because the maximum content of Zn in the present solder is 7 mass %.

Figure 6:
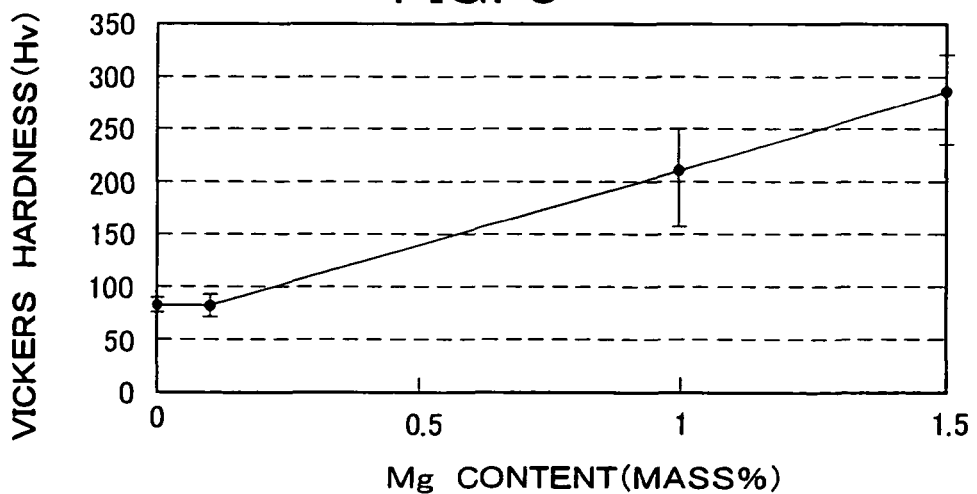
FIG. 6 is a graph showing the relationship between the Mg content and Vickers hardness.

Furthermore, FIG. 6 is a graph showing the effect of Mg on Vickers hardness. The graph shows the result of measuring Vickers hardness of the bulk of alloys in which the Mg content has been varied at 0 mass %, 0.1 mass %, 1 mass %, and 1.5 mass % in a composition comprising 8 mass % of Zn, 0.075 mass % of Ag, 0.02 mass % of Al, and 0.05 mass % of Bi, with the balance being Sn.

Vickers hardness was measured in accordance with JIS Z2244 under a test load of 15 g and a pressure time of 10 seconds. In the present invention, Al is added to increase the strength inside the Zn-rich phase or in the vicinity of the Zn-rich phase by modifying the Zn-rich phase in order to prevent a reduction in the strength of the solder-joined areas caused by the oxidation corrosion of Zn in a highly humid atmosphere, but adding Mg is effective for increasing the hardness. It is apparent from FIG. 5, however, that the material is hard and brittle. Measuring the melting point by using DSC shows that adding magnesium can reduce the melting point of the solder of the present invention, and that this approach is best for allowing conventional components to be mounted at the guaranteed heatproof temperature by using conventional equipment.

Figure 7:
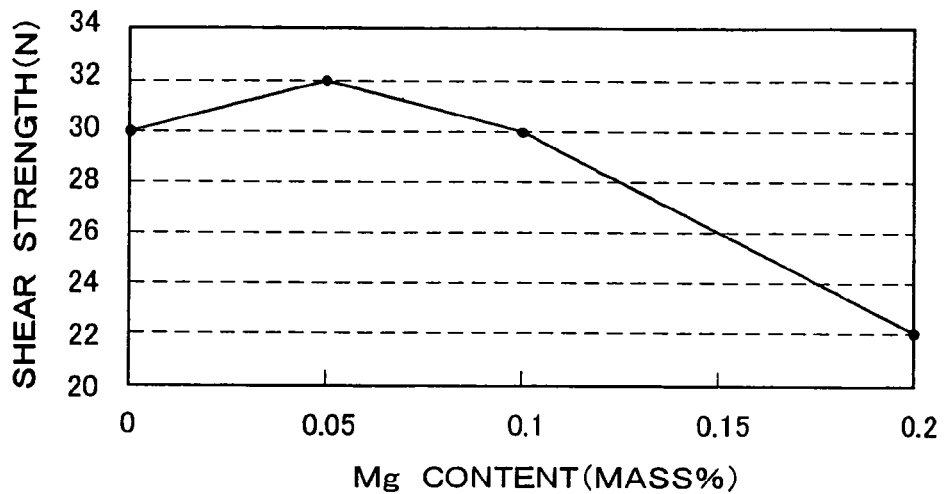
FIG. 7 is a graph showing the relationship between the Mg content and shear strength of a chip resistor.

FIG. 7 is a graph showing the effect of the Mg content on the shear strength. The composition of the solder for which the shear strength was measured was 8 mass % of Zn, 0.075 mass % of Ag, 0.02 mass % of Al, and 0.05 mass % of Bi. The Mg content was varied at 0 mass %, 0.05 mass %, 0.1 mass %, and 0.2 mass %, with the balance being Sn. A powder was formed from these alloy compositions, a solder paste was formed by kneading an ordinary weakly activated flux in an amount of about 10% with respect to the entire weight of the solder, and a 1.6 mm×0.8 mm chip resistor was mounted using the solder paste. The shear strength of the chip resistor was then measured using a shear strength measuring instrument 81 shown in FIG. 8.

Figure 8A:
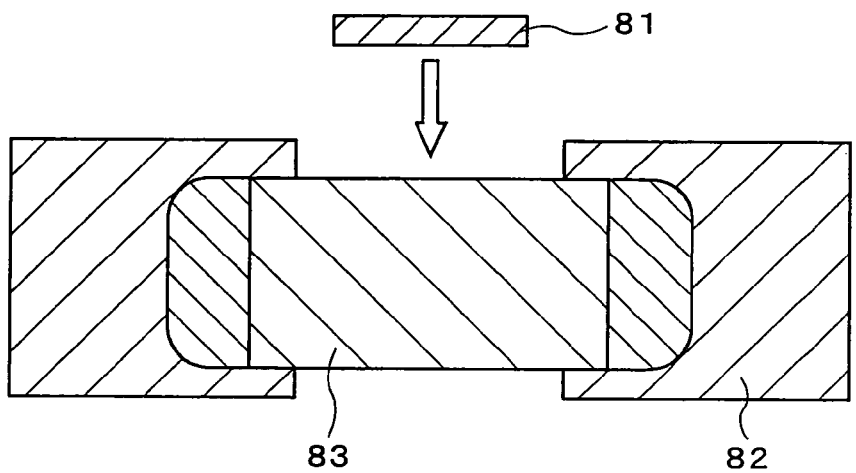
FIGS. 8A and 8B are schematic diagrams showing an example of the method of measuring the shear strength of a chip resistor.
Figure 8B:
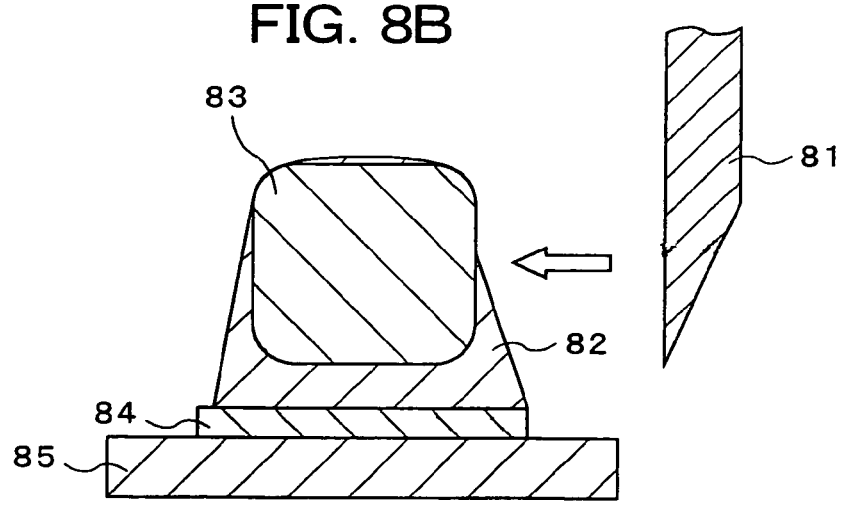

FIG. 8 is a schematic diagram showing the method for measuring the shear strength of the chip resistor. A solder 82 in the form of a paste was printed on a circuit board electrode 84 using a metal mask, the electrode of the chip resistor was mounted in a prescribed position on the circuit board electrode, and the chip resistor 83 was mounted on the circuit board 85 by melting the solder in a reflow oven. The instrument was pressed against the center portion in the lengthwise direction of the mounted chip resistor 83, and the strength, i.e., the shear strength required to break a joined area, was measured by applying a load from the instrument 81 against the chip resistor 83 in the shear direction, as indicated by the arrows in FIGS. 8A and 8B.

It is apparent from FIG. 7 that when the Mg content exceeds 0.1 mass %, the brittleness becomes considerable due to the hard Zn—Mg intermetallic compound shown in FIG. 5. Since the shear strength of the solder alloy is less than when Mg is not added, the Mg content is set to be 0.1 mass % or less when Mg is added.

Figure 9:
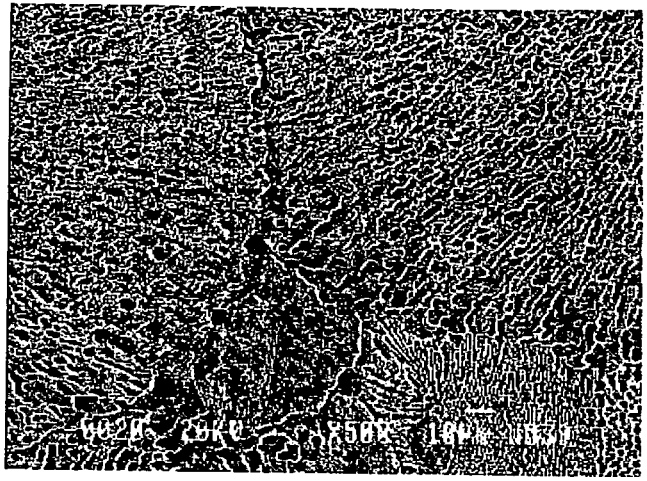
FIG. 9 shows an SEM photograph of solder having a Zn-5Al-1Cu composition.

Next, FIG. 9 is an SEM photograph taken to study the effect of adding Al and Cu on the Zn-rich phase in the solder of the present invention. The solder was obtained by melting and solidifying a composition consisting of Zn-5Al-1Cu, polishing the bulk surface, and observing the alloy structure.

When Al and Cu are added to solder that has an Sn—Zn eutectic structure as the parent phase, the Al and Cu have an effect on the Zn-rich phase in the solder because Al and CU substantially do not form a solid solution in Sn, and trace amounts of Al and Cu form a solid solution in the Zn. It is apparent from FIG. 9 that even when Cu is added, the dense eutectic structure produced by the Zn-rich phase and the Al-rich phase is maintained. Adding Cu increases the hardness in comparison with the results of measuring the Vickers hardness of Zn-5Al in FIG. 10 described below. However, this addition does not lead to a stress concentration along the grain boundaries because a coarse precipitate phase does not form, and it is apparent that the material has a high-toughness structure. It was furthermore confirmed that the tensile strength of the bulk of the solder alloy of the present invention is increased due to the strengthening of the Zn-rich phase by the addition of Cu. Since the effect on Vickers hardness was not observed with the addition of Cu in an amount of 0.1 mass % or less with respect to the weight content of Zn, there is no effect when the Zn is present in a minimum content of 7 mass % in the solder, i.e., when the Cu content is 0.007 mass % or less. A Cu content that does not increase the melting point was considered, and it was learned that the Zn-rich phase in the solder is strengthened by the addition of aluminum and copper, and that strength degradation in a highly humid atmosphere can be prevented when the Cu content in the present solder is 0.007 mass % or more and 0.1 mass % or less, as shown in FIG. 11 described below.

Figure 10:
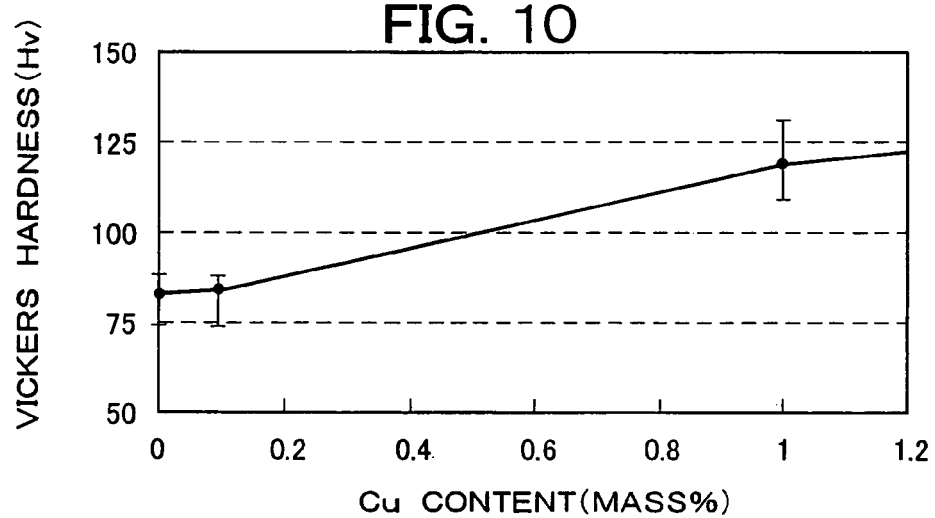
FIG. 10 is a graph showing the relationship between the Cu content and Vickers hardness.

FIG. 10 shows the results of measuring the Vickers hardness of the bulk of an alloy composition in which the Al content was changed to 5 mass %, the Cu content was varied at 0 mass %, 0.1 mass %, and 1.0 mass %, and in which the balance was Zn. The measurement of Vickers hardness was performed in accordance with JIS Z 2244 under a test load of 15 g and a pressure time of 10 seconds.

When a comparison was made of Zn-5Al and Zn-5Al-1Cu, it was found that in the measurement results of the Vickers hardness in FIG. 10, the Vickers hardness increased in the copper-added composition of Zn-5Al-1Cu. It was confirmed that strength increases inside and in the vicinity of the Zn-rich phase and that the tensile strength is enhanced when the Cu content is increased not only in ingots comprising Zn, Al, and Cu, but also in the solder of the present invention, which has an Sn—Zn eutectic structure as the base metal. When the added content of Cu is 0.1 mass % or less with respect to the weight content of Zn, the Vickers hardness is not affected. There is therefore no effect when Cu is added in an amount of 0.007 mass % or less if the Zn content in the present solder is the minimum 7 mass %.

Figure 11:
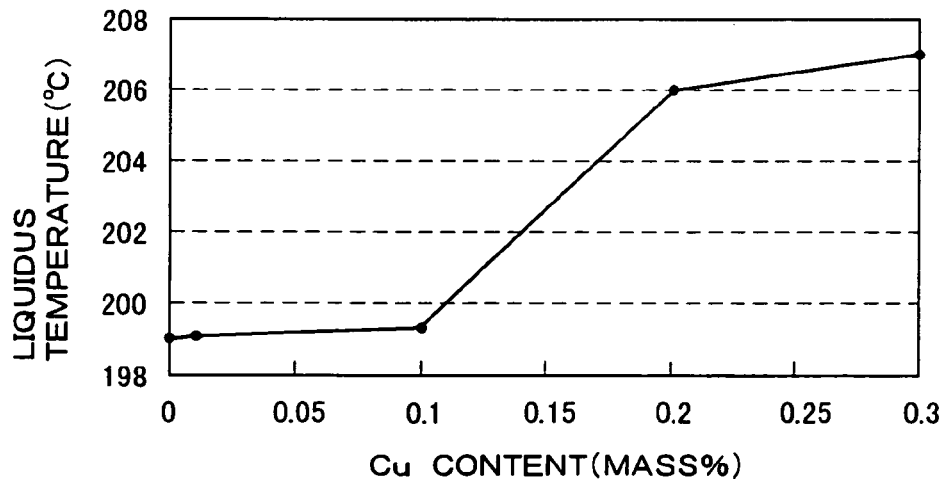
FIG. 11 is a graph showing the relationship between the Cu content and the liquidus temperature.

Furthermore, FIG. 11 shows the results of measuring the liquidus temperature of the bulk of an alloy composition which had 8 mass % Zn, 0.1 mass % Ag, and 0.02 mass % Al, in which the Cu content was varied from 0 to 0.3 mass %, and in which the balance was Sn. From the results of FIG. 11, when the Cu content was 0.01 mass % or less, there was no variation in the liquidus temperature in comparison with not adding Cu; when 0.01 mass % or more of Cu was added, the liquidus temperature gradually increased until the content reached 0.1 mass %; and when 0.1 mass % or more of Cu was added, the liquidus temperature rapidly increased to 200° C. or higher. An increase in the melting point makes it difficult to reflow the solder in a conventional temperature profile, and the reflow temperature profile must be increased. For this reason, the effective Cu content is 0.1 mass % or less when considering the reliability of mounted products because it is possible that a temperature profile would be required that is higher than the guaranteed heatproof temperature of conventional components.

FIG. 12 is an SEM photograph taken to study the effect of adding Al, Mg, and Cu on the Zn-rich phase in the solder of the present invention. The solver was prepared by melting and solidifying a composition consisting of Zn-5Al-1Mg-1Cu, polishing the bulk surface, and observing the alloy structure. When Al, Mg, and Cu are added to solder that has an Sn—Zn eutectic structure as the parent phase, the Al, Mg, and Cu have an effect on the Zn-rich phase in the solder because Al, Mg, and CU substantially do not form a solid solution in Sn, and trace amounts of Al, Mg, and Cu form a solid solution in Zn.

In the case of the Zn-5Al-1Mg shown in FIG. 5, a hard Mg—Zn intermetallic compound was formed by adding Mg to Zn-5Al in order to reduce the melting point, and since the material became coarse, the structure was very brittle under concentrated stress. However, the hard Mg—Zn intermetallic compound phase can be dispersed by adding Cu, which is apparent in FIG. 12. For this reason, the hardness can be made less than that of Zn-5Al-1Mg, which is apparent from the measurement results of Vickers hardness of FIG. 13 described below, and the strength is greater than that of Zn-5Al-1Cu. Since the alloy structure is dense, there is no damage from concentrated stress along the grain boundaries of a coarse structure such as the Zn-5Al-1Mg shown in FIG. 5, and a high-toughness structure can be obtained. This effect was observed when the Cu content was substantially the same as the Mg content, and also when the content was 0.1 mass % or higher and 1 mass % or less with respect to the Zn content. In other words, when Mg is added according to the present solder, it is advantageous to also add Cu in terms of reliability in the connection locations that undergo stress. The Cu content in the present solder is substantially equal to the Mg content, and 0.007 mass % or more and 0.1 mass % or less is preferably added in order to improve the toughness of the material and to keep the melting point from increasing.

Figure 13:
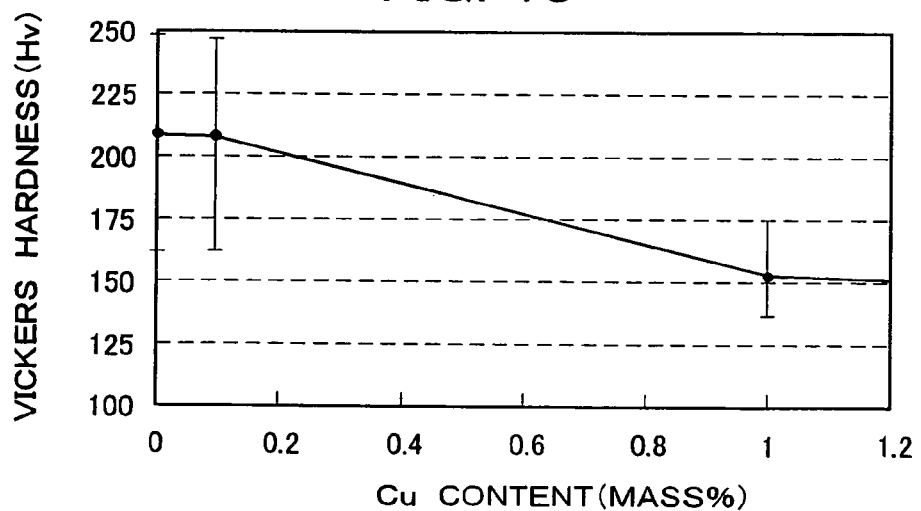
FIG. 13 is a graph showing the relationship between the Cu content and Vickers hardness.

FIG. 13 is a graph showing the effect of the Cu content on the Vickers hardness. FIG. 13 shows the result of measuring the Vickers hardness of the bulk of alloys in which the Al content was 5 mass %, the Mg content was 1 mass %, and the Cu content was varied at 0 mass %, 0.1 mass %, and 1 mass %, with the balance being Sn.

It is apparent from the structural photograph of FIG. 12 and the results of measuring the Vickers hardness in FIG. 13 that the hardness is less than that of Zn-5Al-1Mg, and the toughness can be increased. This is due to the fact that, as can be seen in the structural photograph of FIG. 5, the hard Zn—Mg intermetallic compound phase formed by adding Mg can be very finely dispersed by adding Cu, as shown in FIG. 12.

For this reason, a high-toughness material can be obtained without brittleness damage caused by the concentration of dislocations occurring in a coarse hard phase when stress is applied. It was also found from the measurement results of the Vickers hardness in FIG. 10 that the strength of the alloy structure was greater than when 0 to 1.0 mass % of Cu was added to Zn-5Al. It was confirmed that tensile strength and elongation increase when the Cu content is increased not only in ingots comprising Zn, Al, Mg, and Cu, but also in solder containing Al and Mg, which has the Sn—Zn eutectic structure of the present invention as the base metal. Thus, this approach is very advantageous from the aspect of increasing the reliability of the product because a higher-toughness Zn-rich phase in the present solder can retain the initial strength, even in a high-temperature, high-humidity atmosphere.

Figure 14:
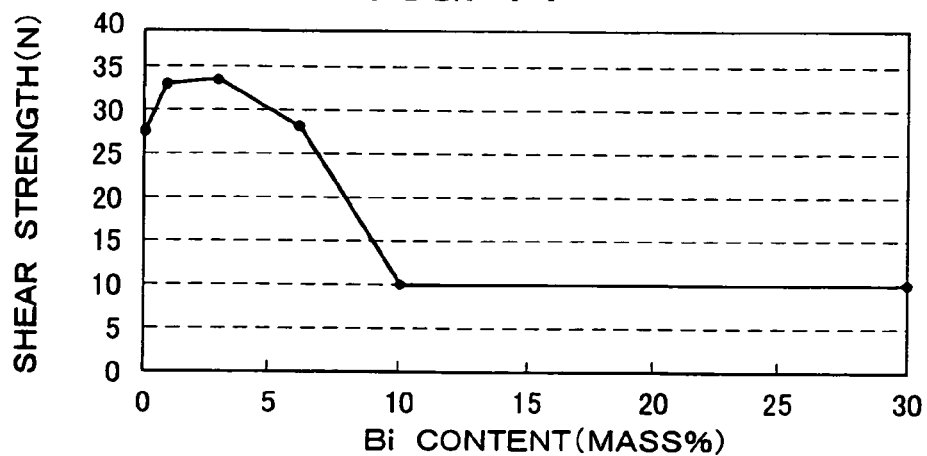
FIG. 14 is a graph showing the relationship between the Bi content and shear strength.

FIG. 14 is a graph showing the effect of the Bi content on the shear strength. FIG. 14 shows the result of measuring the shear strength by forming alloy powders with particle diameters of 20 μm to 40 μm using the solder of the present invention, wherein the alloy composition was 8 mass % of Zn, 0.075 mass % of Ag, 0.02 mass % of Al, 0.01 mass % of Mg, and 0.01 mass % of Cu; the Bi content was varied at 1 mass %, 3 mass %, 6 mass %, 10 mass %, and 30 mass %; and the balance was Sn. A cream solder was formed by kneading weakly activated flux, and a 1.6 mm×0.8 mm chip resistor was mounted on a circuit board using the cream solder and was subjected to a heat cycle test in which the mounted chip was alternately exposed for about 30 minutes to temperatures of −40° C. and 125° C. The force required to shear the mounted chip resistor in the horizontal direction as shown in FIG. 8 was then measured.

Ordinary Cu electrodes were used on the circuit board that was used for mounting. There are advantages to reducing the melting point of the solder alloy with a greater amount of Bi, but when the Bi content is 6 mass % or more, the strength after more than 1,000 heat cycles is lower than when Bi is not added. Therefore, when reliability is considered, the Bi content must be kept at 6 mass % or less. To determine the lower limit of the Bi content, the effect of the content on the melting point was observed by DSC measurement, and a tensile strength of bulk alloys in which the Bi content was varied was measured. As a result, no effect was observed when the content was 0.01 mass % or less, and the Bi content was therefore set to 0.01 mass % or more and 6 mass % or less.

Figure 15:
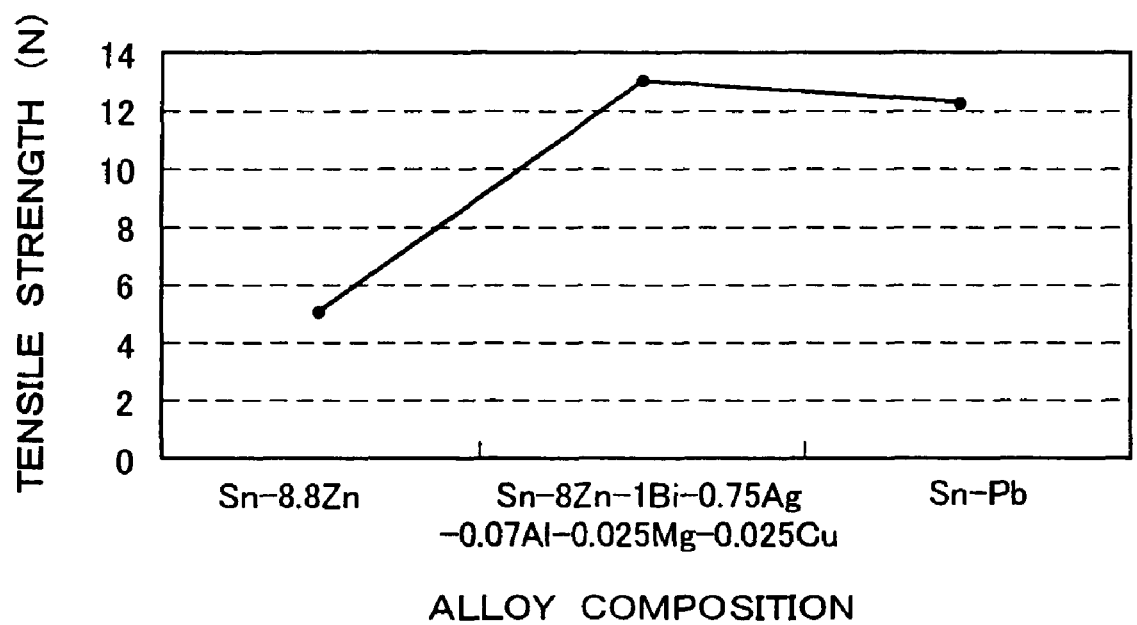
FIG. 15 shows the tensile strength of a QFP lead wire.

FIG. 15 is a graph showing the effect of the alloy composition on the tensile strength. A solder powder according to the present invention was formed from an alloy composition having 8 mass % of Zn, 0.075 mass % of Ag, 1 mass % of Bi, 0.07 mass % of Al, 0.01 mass % of Mg, and 0.01 mass % of Cu, with the balance being Sn. A cream solder was formed by kneading weakly activated flux with the powder. The cream solder was used to connect the copper lead wires of a QFP, which is a type of electronic component, to the cooper electrodes of a circuit board. The component was then held for 1,000 hours in a high-temperature, high-humidity atmosphere of 85° C. and 85%, and the lead wires of the electronic component QFP were pulled upward at 45°. The graph shows the result of measuring the tensile strength, that is, the strength required to damage a solder-joined area.

FIG. 15 furthermore confirms that, in comparison with conventional Sn—Zn eutectic solder, the solder of the present invention has excellent connection reliability in a high-temperature, high-humidity atmosphere because of the increased strength produced by the modified structure of the Zn-rich phase, and that excellent connection reliability can be maintained in comparison with conventional Sn—Pb eutectic solder.

The first effect of the solder of the present invention described above is that the solder alloy material according to the present invention uses tin, which has a low melting point and excellent strength characteristics, and that the biologically harmful lead is not used.

In other words, the solder of the present invention is a eutectic solder alloy composition nearest to 183° C., which is the eutectic temperature of Sn-37Pb eutectic solder. The solder uses a solder material in which Sn-8.8Zn is the parent phase that has a eutectic temperature of 199° C. It is therefore impossible for lead to elute into the ground and be taken into the human body through underground water.

The second effect of the solder of the present invention described above is that an unleaded solder material is used that is a eutectic solder alloy which is nearest to 183° C., the melting temperature of Sn-37Pb eutectic solder. The solder has as the parent phase an Sn-8.8Zn eutectic material, which has a eutectic temperature of 199° C.

In other words, the solder of the present invention has an Sn-8.8Zn eutectic structure as the parent phase, and may contain the following additions: 0.01 mass % or more and 6 mass % or less of bismuth, 0.07 mass % or more and 0.05 mass % or less of aluminum, 0.007 mass % or more and 0.01 mass % or less of copper, and 0.007 mass % or more and 0.01 mass % or less of magnesium. Silver is furthermore preferably added in the above-described range in order to reduce the liquidus temperature of the entire metal component in the cream solder. Therefore, the difference in the melting point with the Sn-37Pb eutectic crystals is 10° C. to 20° C., a reflow oven that can uniformly heat across the entire mounting surface does not need to be newly acquired, and the same reflow oven as used for conventional Sn-37Pb eutectic solder can be used. Costs are not required for installing new equipment. Since the electronic components can be mounted in the same guaranteed heatproof temperature ranges as those employed when conventional Sn-37Pb eutectic solder is used, functionally reliable mounted products can be manufactured.

The third effect of the solder of the present invention described above is that, with the unleaded cream solder of the present invention, high post-mounting connection reliability can be obtained in a high-temperature, high-humidity environment by adding silver, aluminum, magnesium, copper, and bismuth to the Sn—Zn-based solder material in comparison with mounting electronic components on copper-plate electrodes using a solder material that has an Sn—Zn eutectic structure as the parent phase structure.

In other words, in the present invention, a high initial adhesion strength can be obtained by adding 6 mass % or less of bismuth to an Sn—Zn-based solder, but the material becomes brittle at the same time. The initial adhesion strength can be increased by adding 0.075 mass % to 1 mass % of silver, and connection reliability can be obtained in a heat cycle test in which the mounted electronic components are alternately exposed for about 10 to 30 minutes to temperatures of −40° C. and 125° C.

In the present invention, gold does not need to be plated on the copper electrodes in order to improve the reliability of the areas joined with copper. Therefore, the manufacturing cost of the circuit board can be kept the same as that of a conventional Sn—Pb article. However, this is not sufficient to avoid oxidation of the Zn-rich phase in the solder and to prevent strength degradation in a high-temperature, high-humidity atmosphere of 85° C. and 85%.

In view of the above, in the present invention, 0.07 to 0.5 mass % of Al, 0.007 to 0.1 mass % of Mg, and 0.007 to 0.1 mass % of Cu are added to ensure a stronger Zn-rich phase. Aluminum substantially does not form a solid solution in Sn, a fine-grained, Al-rich phase precipitates inside or in the vicinity of the Zn-rich phase, and the strength is enhanced. Furthermore, a hard Zn—Mg intermetallic compound phase precipitates in the Zn-rich phase, and strength is enhanced, by the addition of Mg as well. Cooper is also preferably added when magnesium is added. Because copper acts to very finely disperse the Zn—Mg intermetallic compound phase, the solder can be made strong and tough. When 1 mass % or more of Ag is added, the enhanced toughness by the solid solution of the silver in metallographic structure is lost, the Ag-rich phase precipitates, the melting point rapidly increases, and the melting-point range in which the solid and liquid phases coexist increases. Therefore, concentration segregation readily occurs in the solder, the precipitate phase in a high temperature environment becomes coarse, the corrosion within the solder readily occurs in conjunction with the formation of coarser grains, and the connection reliability of joined areas is lost.

In contrast, with the solder according to the present invention, the strength inside or in the vicinity of the Zn-rich phase is increased by the Al-precipitate phase. This is achieved by adding a trace amount of Al in order to increase the strength of the Zn-rich phase, which is susceptible to become brittle due to oxidation. The strength of the Zn-rich phase is increased and the melting point is reduced by furthermore adding Mg and Cu. Also, structures other than the Zn-rich phase are strengthened by adding Bi and Ag. The material is thereby endowed with excellent reliability in a high-temperature, high-humidity atmosphere and can be used as a substitute material for Sn-37 mass % Pb eutectic solder.

INDUSTRIAL APPLICABILITY

The present invention is an unleaded solder that has the same melting point as the conventional Sn-37Pb eutectic solder, has the same processability, service conditions, and connection reliability, and can be very useful as non-polluting solder.

The invention claimed is:

1. A solder having a composition comprising 7 to 10 mass % of Zn, 0.075 to 1 mass % of Ag, 0.07 to 0.5 mass % of Al, 0.007 to 0.1 mass % of Cu, and 0.007 to 0.1 mass % of Mg, with the balance being Sn and unavoidable impurities.

2. A mounted article, comprising an electronic component, and a circuit board in which said electronic component is soldered using the solder according to claim 1.

3. A solder having a composition comprising 7 to 10 mass % of Zn, 0.075 to 1 mass % of Ag, 0.07 to 0.5 mass % of Al, 0.01 to 6 mass % of Bi, and 0.007 to 0.1 mass % of Mg, with the balance being Sn and unavoidable impurities.

4. A mounted article, comprising an electronic component, and a circuit board in which said electronic component is soldered using the solder according to claim 3.

5. A solder having a composition comprising 7 to 10 mass % of Zn, 0.075 to 1 mass % of Ag, and 0.07 to 0.5 mass % of Al, 0.01 to 6 mass % of Bi, 0.007 to 0.1 mass % of Cu, and 0.007 to 0.1 mass % of Mg, with the balance being Sn and unavoidable impurities.

6. A mounted article, comprising an electronic component, and a circuit board in which said electronic component is soldered using the solder according to claim 5.

* * * * *